(12) United States Patent
Singh et al.

(10) Patent No.: US 8,165,835 B1
(45) Date of Patent: Apr. 24, 2012

(54) COMPLEX WAVELET FILTER BASED POWER MEASUREMENT AND CALIBRATION SYSTEM

(75) Inventors: Rahul Singh, Austin, TX (US); Dale Brummel, Spicewood, TX (US); Hang Liu, Austin, TX (US); Robert Leon Gorsegner, Austin, TX (US); Edwin De Angel, Austin, TX (US); Jean Charles Pina, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 589 days.

(21) Appl. No.: 12/259,112

(22) Filed: Oct. 27, 2008

Related U.S. Application Data

(60) Provisional application No. 60/982,841, filed on Oct. 26, 2007.

(51) Int. Cl.
  *G01R 19/00* (2006.01)
  *G06F 17/40* (2006.01)
(52) U.S. Cl. ............ 702/64; 702/60; 702/61; 702/190; 324/141
(58) Field of Classification Search .................... 702/64, 702/60, 61, 190, 197
  See application file for complete search history.

(56) References Cited

U.S. PATENT DOCUMENTS

| | | | |
|---|---|---|---|
| 4,870,593 A * | 9/1989 | Said ................................ 702/72 |
| 5,301,121 A * | 4/1994 | Garverick et al. ............. 702/60 |
| 5,345,409 A * | 9/1994 | McGrath et al. ................ 702/60 |
| 5,448,747 A * | 9/1995 | Garverick et al. ............ 711/156 |
| 5,521,482 A * | 5/1996 | Lang et al. .................... 318/800 |
| 6,211,626 B1 | 4/2001 | Lys et al. |
| 6,522,982 B1 * | 2/2003 | Pastorello et al. .............. 702/61 |
| 6,888,322 B2 | 5/2005 | Dowling et al. |
| 6,943,714 B2 | 9/2005 | White |
| 6,967,448 B2 | 11/2005 | Morgan et al. |
| 6,975,079 B2 | 12/2005 | Lys et al. |
| 7,064,498 B2 | 6/2006 | Dowling et al. |
| 7,135,824 B2 | 11/2006 | Lys et al. |
| 7,255,457 B2 | 8/2007 | Ducharm et al. |
| 2001/0049590 A1 * | 12/2001 | Wegerich ...................... 702/189 |
| 2005/0123063 A1 * | 6/2005 | Liu ................................ 375/295 |

OTHER PUBLICATIONS

Driesen et al., "Active Power Filter Control Algorithms using Wavelet-based Power Definitions", 2002, IEEE, pp. 466-471.*

Lin et al., "Boundary Protection Using Complex Wavelet Transform", Nov. 2003, Proceedings of the 6th International Conference on Advances in Power System Control, Operation and Mangagement, APSCOM 2003, pp. 744-749.*

(Continued)

*Primary Examiner* — Hal Wachsman
(74) *Attorney, Agent, or Firm* — Mitch Harris, Atty at Law, LLC; Andrew M. Harris

(57) ABSTRACT

A power measurement and calibration system provides power and line frequency measurements by using a bandpass filter having complex voltage and current outputs from which real and imaginary power components can be determined. Calibration of the filter may be omitted if a complex wavelet filter is used to implement the bandpass filter and a determination of line frequency can also be provided for downstream use. A processor receiving data from the output of the filter can compute real and imaginary power, power factor and the line frequency. The filter may be implemented by a processor executing program instructions, or a digital circuit implementing the filter and optionally a CORDIC rotator for computing the current-to-voltage phase relationship can provide input to the processor for power measurement and calibration of the sample rate to line frequency relationship and for other uses.

28 Claims, 5 Drawing Sheets

OTHER PUBLICATIONS

Mitrovic, et al., "A Fast and Accurate Method for Phase Angle Autocalibration in the Stable Source of AC Voltage and Current", IMTC 2005—Instrumentation and Measurement Technology Conference, May 2005.

Cnockaert, et al., "Analysis of vocal tremor by means of a complex wavelet transform", International Conference on Voice Physiology and Biomechanics, Aug. 2004, Marseilles, France.

Driesen, et al., "Wavelet-based Power Quantification Approaches", IEEE Instrumentation and Measurement Technology Conference, May 2002, Anchorage, AK.

Driesen, et al., "Time-Frequency Analysis in Power Measurement using Complex Wavelets", IEEE, 2002.

Analog Devices ADE7754 Datasheet, Aug. 2001.

Cirrus Logic CS5463 Datasheet, Nov. 2005.

Gherasim, et al., "Amplitude, Phase and Frequency Estimation Based on the Analytic Representation of Power System Signals", International Conference on Power Systems Transients, Jun. 2005, Montreal, CA.

Karrari, et al., "Synchronous Generator Model Identification Using Discrete Wavelet Transform", International Conference on Intelligent System Application to Power Systems, 2003, Lemnos, GR.

Wu, et al., "A Comparison of DFT and DWT based Similarity Search in Time-Series Databases", CIKM 2000, McLean VA.

El-Hawary, "Power Engineering Letters", IEEE Power Engineering Review Sep. 2001.

Bhunia, et al., "Defect Oriented Testing of Analog Circuits Using Wavelet Analysis of Dynamic Current" VLSI Test Symposium, Apr. 2002, Monterey CA.

Yoon, et al., "Reactive Power Measurement Using the Wavelet Transform", IEEE Transactions on Instrumentation and Measurement, vol. 49, No. 2, Apr. 2000, Piscataway NJ.

* cited by examiner

COMPLEX WAVELET FILTER BASED POWER MEASUREMENT AND CALIBRATION SYSTEM

The present U.S. patent application claims priority under 35 U.S.C. §119(e) to U.S. Provisional Patent Application Ser. No. 60/982,841, filed on Oct. 26, 2007.

BACKGROUND OF THE INVENTION

1. Field of the Invention

The present invention relates generally to power measurement circuits and systems, and more particularly to a power measurement system that use a complex wavelet filter to provide input for power measurement and system calibration.

2. Background of the Invention

Power measurements performed by integrated circuits (ICs), such as those used in motor control and power supply systems typically measure voltage and current delivered to a load using analog-to-digital converters (ADCs) and then compute a measured power level by multiplying the voltage and current measurements to obtain a power measurement. Systems such as those disclosed in U.S. Pat. No. 5,521,482 typically assume that the measured power is a real power value, or for A/C power measurements, use a power factor to adjust the power calculated from the voltage and current measurements to obtain the real power. Such power computations are accurate for a stable fixed-frequency sine wave. For DC power measurements, the power factor correction is not needed.

However, making accurate A/C power measurements when the frequency and/or amplitude varies rapidly, such as in some A/C motor control applications, and when jitter is present is very difficult and requires extensive computations in order to preserve accuracy of the measurements. Further, measurement of complex power including both real and reactive power metrics is desirable for total modeling of the load conditions which is useful in monitoring and controlling power delivery in applications such as motor control.

Techniques for extracting relative phase and amplitude from voltage and current measurements to determine line power characteristics typically require filtering due to the presence of harmonics and noise on the measurement inputs and since the voltage and current measurements are filtered separately, calibration between the voltage and current channels is typically required to provide accurate input values of line voltage and current for subsequent power calculations. Calibration typically requires additional circuitry and calibration time, and therefore it would be desirable to avoid the necessity of calibrating the channels.

To perform power measurements on a line-cycle basis from sampled data, it is typically necessary to determine the relationship between the line frequency and the sampling frequency, both of which may vary from a specified value, with line frequency typically varying by a significantly larger factor. Typical power measurement circuits determine the line frequency using a zero-crossing detector in conjunction with higher-frequency counters. However, such measurements are affected by the presence of line harmonics and jitter. Therefore, it would be desirable to measure line frequency more accurately.

Therefore, it would be desirable to provide a system and method for measuring voltage/current phase and amplitude for performing line power measurements and calibration of the system. It would further be desirable to provide such a system and method that can determine line frequency accurately.

SUMMARY OF THE INVENTION

The above stated objective of measuring voltage/current phase and amplitude along with line frequency for power measurement and system calibration, is provided in a method and system. The system may be incorporated within an integrated circuit and may be implemented by a processor performing digital signal processing operations on sampled current and voltage data provided by analog-to-digital converters (ADCs), or alternatively, by a dedicated digital signal processing circuit that generates power measurement and calibration output values from the sampled current and voltage data.

The system includes at least one ADC for measuring voltage and current delivered to a load. A filter, which may be implemented by a pair of complex Morlet wavelet band-pass filters performing a discrete wavelet transform (DWT), filters the current and voltage data provided from the ADC(s), removing harmonics and noise, and provides current and voltage samples either to the processor or dedicated digital signal processing circuit, which implements the filter. The filter generates a complex output for both current and voltage, from which power factor is calculated by a processing system or dedicated hardware. Current and voltage magnitudes can be calculated using a discrete Fourier transform (DFT) operation executed (or implemented) along with the DWT operations, to provide an accurate single tone voltage and optionally a current measurement. The current magnitude may alternatively be calculated from the voltage magnitude using the ratio of the voltage to current magnitudes computed in the DWT operations.

Line frequency is calculated by using two DWT voltage measurements having a predetermined time displacement and computing the phase difference between the voltage measurements to determine a difference between a line frequency value related to the sampling frequency and the actual line frequency. The line frequency is used to determine per-cycle power values, as well as to correct the frequency of the sine and cosine waveforms used in the DFT operations for determining voltage and current magnitudes.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses circuits, systems and methods for measuring power in electrical and electronic systems. The present invention is suited for integration in motor control systems and other systems in which measurement of real and imaginary power, e.g., determination of a complex power representation is desirable for providing input to control systems, measuring efficiency and displaying information about the operation of the system, and conditions of the line power supplied to the load. The voltage and current supplied to a load are measured and are filtered using a filter that has complex outputs. In particular, the filter may be a complex Morlet wavelet filter implementing a discrete wavelet transform (DWT). The complex output provides a true measure of real and imaginary voltage and current components, from which power factor and the magnitude and phase of the voltage and current can be determined.

Line frequency can further be determined by observing the change in phase of the load voltage (load voltage phase derivative) and relating the change in phase to a fixed sample frequency. The line frequency determined from the phase derivative can be used to correct the measurements by setting the number of samples over which the measurement values are averaged to yield power measurement output values, as well as to compute per-cycle values of voltage, current and power measurements. Accurate voltage and current measurements can be determined from a separate discrete Fourier transform (DFT) calculation that rejects harmonic information in the voltage and current measurements. The current can be computed from a voltage DFT measurement using the current-to-voltage relationship obtained from the DWT operations. The method and system can be implemented by program instructions executed by a processor having voltage and current inputs provided from analog-to-digital converters (ADCs), or by dedicated digital signal processing hardware coupled to the ADCs.

Figure 1:
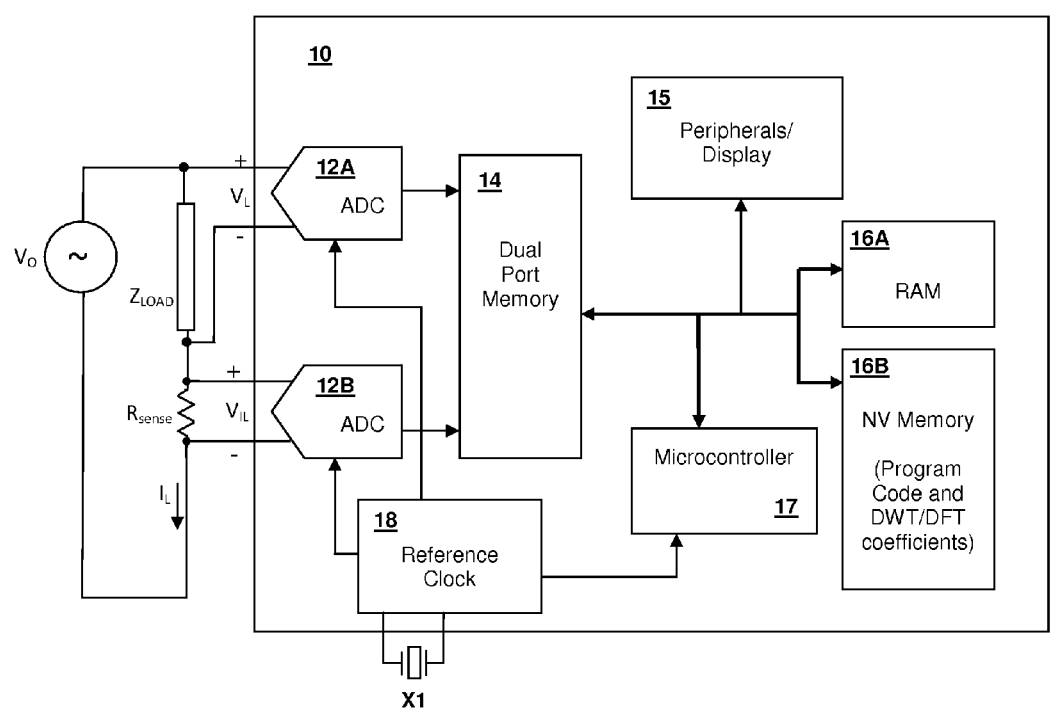
FIG. 1 is a block diagram depicting a power measurement system in accordance with an embodiment of the present invention.

Referring now to FIG. 1, a power measurement system 10 in accordance with an embodiment of the present invention is shown. Two voltages are provided as inputs to the system. The first $V_L$, provided to analog-to-digital converter (ADC) 12A, is representative of the voltage supplied to a load $Z_{LOAD}$, and may be provided directly or by a voltage divider or another suitable scaling circuit. The second voltage $V_{IL} = k_1 I_{LOAD}$, where $k_1$ is a constant relating the load current to second voltage $V_{IL}$, is representative of the current supplied to load $Z_{LOAD}$ and may be obtained by series sense resistor $R_{SENSE}$, or alternatively by a current mirror, current transformer or another suitable current-sensing circuit. If the output of the current-sensing circuit generates a current, then ADC 12B may have a current input rather than having a voltage input as depicted in FIG. 1. The output of ADCs 12A and 12B is provided to the input of a dual port memory 14, which is coupled to a microcontroller 17 which performs the filtering operations and calculations for the DWT and DFT, as well as other calculations including power factor, line frequency and current and/or voltage magnitudes. Dual port memory 14 is not required, but provides for collection of ADC data without taking bus bandwidth or execution cycles from microcontroller 17. In accordance with an alternative embodiment of the invention, in which dual port memory 14 is not included and the outputs of ADCs 12A and 12B are coupled directly to microcontroller 17, microcontroller 17 can read values directly from ADCs 12A and 12B.

Microcontroller 17 is coupled to a random-access memory (RAM) 16A for storing intermediate results of calculations as well as to a non-volatile RAM (NVRAM) 16B, which stores program instructions (program code) for execution by microcontroller 17 as well as tables to implement the DWT transform and sine and cosine values for the DFT. Alternatively, dedicated hardware such as a CORDIC circuit can be used to provide the sine and cosine values from a phase value. Microcontroller 17 is also coupled to peripherals/display block 15, which provide communications to/from power measurement system 10 and optionally display of values measured by power measurement system 10. Power measurement system 10 may be implemented on a single die as an integrated circuit, and in such implementations, the display and peripherals will generally be external to the integrated circuit, and only their communication interfaces are included within the integrated circuit. A reference clock 18 is supplied with a reference by a crystal X1, which provides an accurate timebase for sampling load voltage $V_L$ and current-sensing voltage $V_{IL}$.

Figure 2:
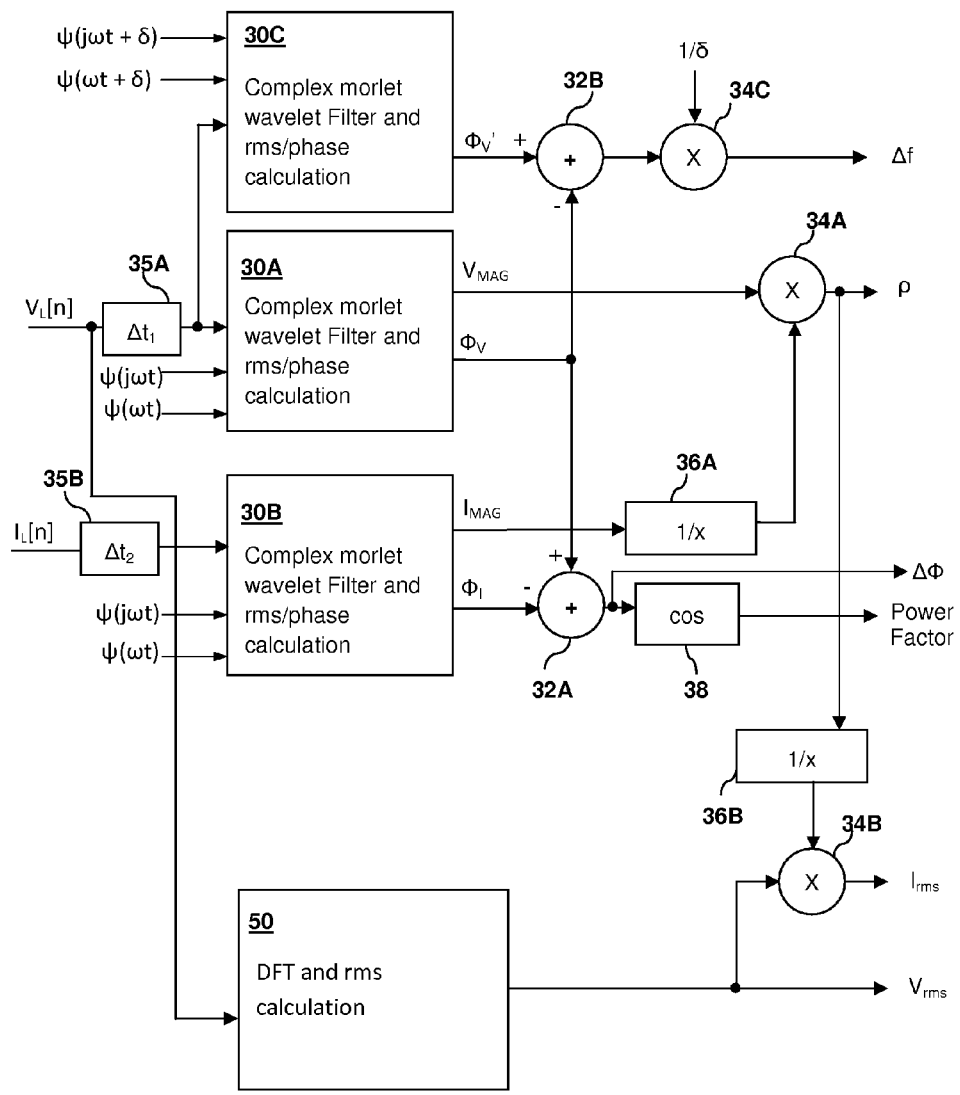
FIG. 2 is a block diagram depicting an algorithm implemented by the system of FIG. 1, or alternatively a dedicated digital circuit for implementing the algorithm, in accordance embodiments of the present invention.

Referring now to FIG. 2, a block diagram of an algorithm executed by microcontroller 17, which alternatively may be embodied in a dedicated digital circuit, is shown. A complex Morlet wavelet filter and rms/phase calculation block (filter) 30A receives load voltage samples $V_L[n]$ from ADC 12A and generates a load voltage magnitude output $V_{MAG}$ and a load voltage phase output $\Phi_V$ by convoluting voltage samples $V_L[n]$ with DWT coefficients $\psi(\omega t)$ and $\psi(j\omega t)$ determined according to reference clock 18. Another filter block 30B receives load current samples $I_L[n]$ from ADC 12B and generates a load current magnitude output $I_{MAG}$ and a load current phase output $\Phi_I$. Delay lines 35A and 35B provide for delay of load voltage samples $V_L[n]$ and/or load current samples $I_L[n]$ according to system calibrations determined as described in further detail below. Filter 30A performs a convolution between the voltage samples and the complex Morlet wavelet coefficients to provide a band-pass filtered output that rejects noise and harmonics to some degree. Similarly, filter 30B performs a convolution between the measured load current values and the complex Morlet wavelet coefficients. However, for highly accurate voltage and current magnitude measurements, a DFT and rms calculation block 50 is provided to convolve load voltage samples $V_L[n]$ with sine and cosine wavetable values to generate an rms voltage output $V_{rms}$ in which harmonics are rejected, so that $V_{rms}$ accurately represents only the line voltage fundamental frequency component. While the particular embodiment illustrated in FIG. 1 utilizes a complex Morelet wavelet for filters 30A and 30B, another finite-impulse response (FIR) filter can be used instead, including other wavelet type filters.

During a calibration interval, at startup or at another time, reference signals can be supplied to the voltage and current measurement inputs. The difference between load current phase output $\Phi_I$ and load voltage phase output $\Phi_V$ is stored in memory 14, and used to adjust delay lines 35A and 35B to yield calibrated results. Only one of delay lines 35A and 35B is required to obtain calibrated phase, but both delay lines 35A and 35B may be used in conjunction. The phase calibration is provided to remove errors generally due to external circuit errors, such as a phase delay in the current sensing circuit, and therefore suitable calibration might be performed under, for example, zero-load conditions for the actual system circuit implementation on a per-system basis. Depending on system configuration, calibration may be factory-performed and may only be needed after manufacturing the overall system, or may be needed only at infrequent intervals, such as periodic system maintenance, in which case the calibration values can be stored in a non-volatile storage and retrieved at startup. Calibration can be performed at any phase angle between the current and voltage values, and by adjusting delay blocks 35A and 35B, any phase relationship can be set, as long as the adjustment range of at least one of delay blocks 35A and 35B is sufficiently wide. The phase computation can be performed using a CORDIC algorithm or dedicated circuit, computation of a Taylor series expansion, or via a look-up table.

Load current rms value $I_{rms}$ is calculated from a ratio ρ between the load voltage and current magnitudes generated by filters 30A and 30B. Voltage $V_{rms}$ is multiplied by 1/ρ as computed by reciprocal operation block 36B by a multiplier block 34B to yield load current rms value $I_{rms}$. Ratio ρ is computed by a multiplier 34A from load voltage magnitude $V_{MAG}$ and the reciprocal of load current magnitude $I_{MAG}$ as provided by reciprocal operation block 36A. The use of ratio ρ to compute load current rms value $I_{rms}$ saves computation time (or circuit area in dedicated logic embodiments). However, $I_{rms}$ can be determined in a manner similar to that used to determine voltage $V_{rms}$, by providing a DFT channel that processes the output of ADC 12B to compute an rms current value according to an algorithm (or logic) as specified for DFT and rms calculation block 50, which is illustrated in further detail below for the rms voltage ($V_{rms}$) calculation.

Load power factor is computed from load voltage phase output $\Phi_V$ computed by filter block 30A and load current phase output $\Phi_I$ computed by filter block 30B, by a subtraction block 32A followed by a cosine block 38, which together compute Power Factor=$\cos(\Phi_V-\Phi_I)$. The output of subtraction block 32A also provides a phase difference output ΔΦ, which can be used to calibrate the voltage/current channel relationship described above, with ΔΦ set to any specified angle, according to system calibration needs, by adjusting one or both of delay lines 35A and 35B.

A voltage channel phase derivative used to determine the relationship between an expected line frequency according to the frequency of reference clock 18, and the actual line frequency is determined by a third DWT Filter 30C, which convolves voltage samples $V_L[n]$ with offset DWT coefficients ψ(ωt+δ) and ψ(jωt+δ), where delta is an offset selected to avoid frequency aliasing, generally a line frequency cycle or a fraction of a line frequency cycle. The difference between phase load voltage phase outputs $\Phi_V$ and $\Phi_V'$ is obtained from subtraction block 32B and is multiplied by 1/δ by multiplier block 34C to obtain the phase derivative, which is a frequency difference Δf. Frequency difference Δf yields the difference between the "expected" line frequency referenced to the sample frequency generated by reference clock 18 of FIG. 1, and the true line frequency, which is equal to the derivative of the phase of load voltage $V_L$. The calculated line frequency may be averaged over many measurements to yield an accurate measurement of the line frequency, or may be used with no averaging to provide a cycle-by-cycle frequency variation estimate. The measured line frequency is used to determine the number of DWT output samples used in the final computations generated from the voltage and current magnitude and phase values, so that if the line clock frequency deviates from the "expected" value of the line clock frequency determined according to a division of the reference clock frequency, the number of DWT output samples used in the averaging in the output computations (e.g., power factor, real and imaginary power, voltage magnitude, current magnitude) can be adjusted to match the actual line frequency.

The difference computation yielded by the output of multiplier 34C can also be used to correct/control the sine and cosine waveform values supplied to DFT and rms calculation block 50, so that the phase and frequency of the DFT is matched to the line frequency. The measured line frequency value may also be used to "gate" cycle-by-cycle measurement outputs provided to outputs such as peripherals/display 15, thereby providing a cycle-by-cycle measurement of power factor and voltage and/or current magnitudes, as well as other power calculation values such as real and imaginary power values.

Figure 3:
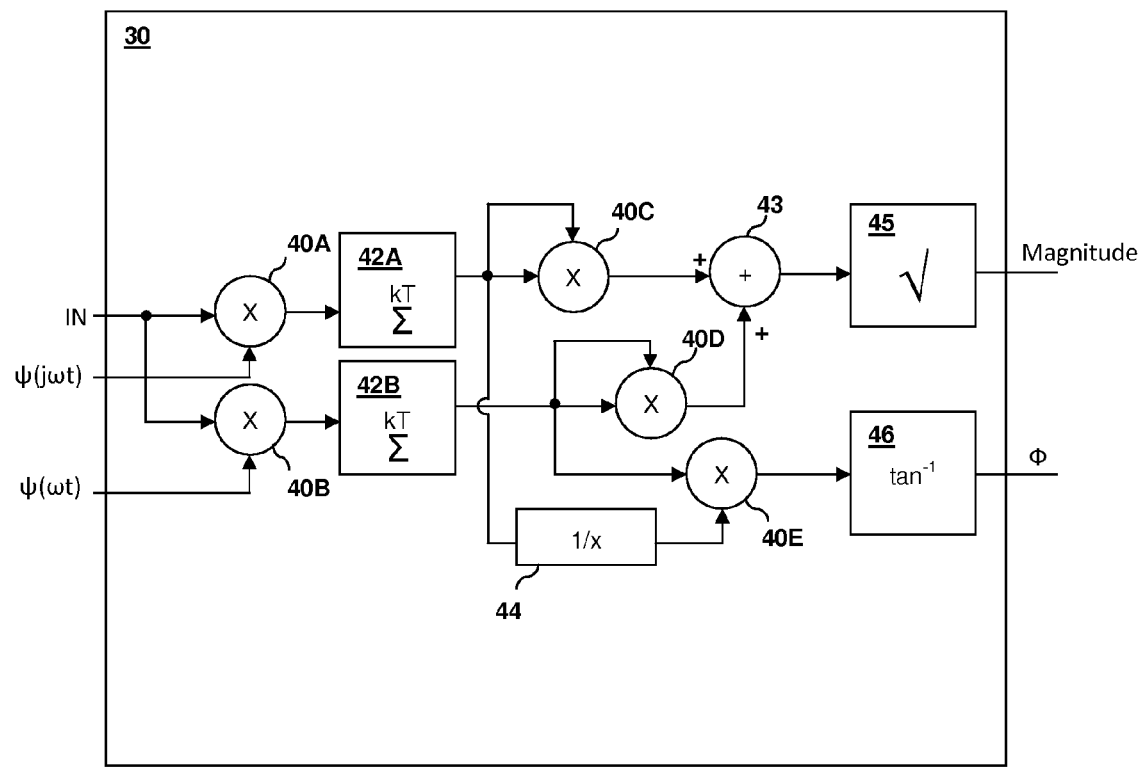
FIG. 3 is a block diagram depicting details of a filter and rms/phase calculation block 30 that can be used to implement filter and rms/phase calculation blocks 30A and 30B of FIG. 2.
Figure 5:
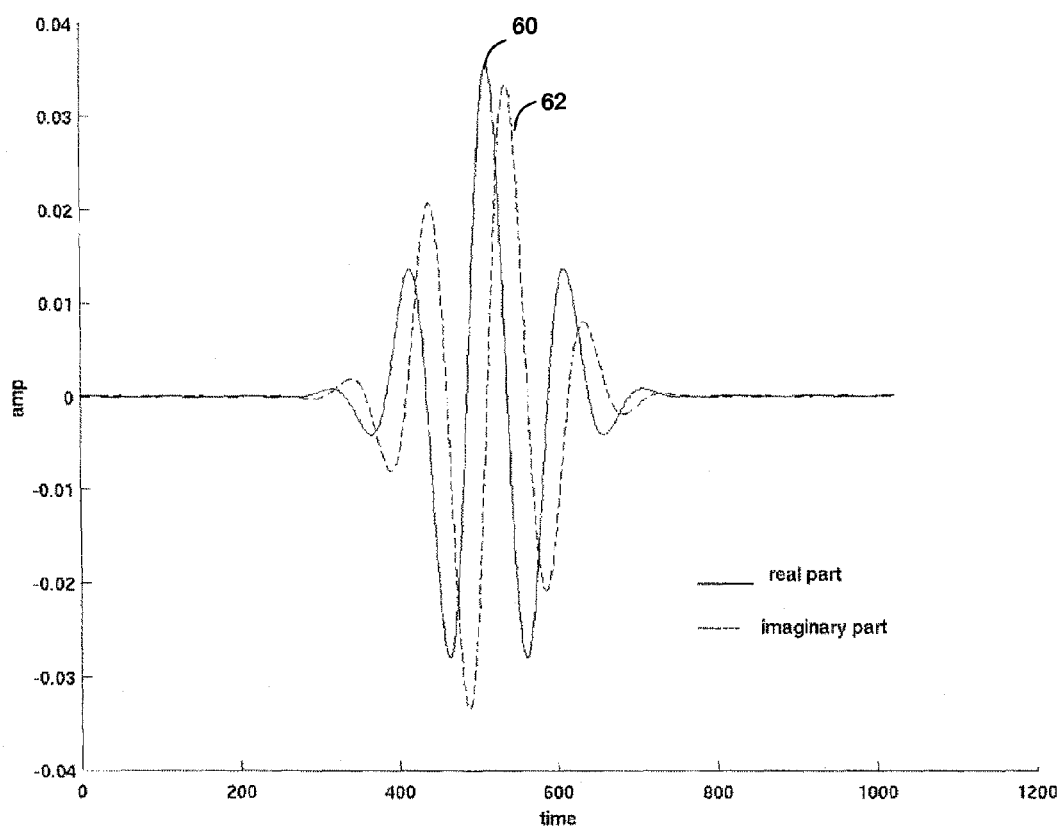
FIG. 5 is a pictorial diagram depicting a coefficient profile of a complex Morlet wavelet transform as provided to filter and rms/phase calculation blocks 30A and 30B of FIG. 2.

Referring now to FIG. 3, details of filter blocks 30A and 30B are shown in a filter block 30 that can be used to implement filter blocks 30A and 30B, in accordance with an embodiment of the invention. Filtering is performed by a pair of multipliers 40A,40B, which multiply input values provided at input IN by a pair of coefficients ψ(ωt) and ψ(jωt), (ψ(ωt+δ) and ψ(jωt+δ) for Filter 30C) provided from look up tables (or other means) as illustrated in FIG. 5. FIG. 5 shows a complex Morlet wavelet transform with real part ψ(ωt) 60 and imaginary part ψ(jωt) 62, which are multiplied by multipliers 40A and 40B with voltage or current input values, respectively. The outputs of multipliers 40A and 40B are accumulated by respective discrete integrators 42A, 42B to yield real and imaginary transform output component values. The magnitudes of the real and imaginary transform output components are squared by multiplier blocks 40C and 40D, added by summation block 43, and the square root is taken of the resulting sum by block 45 to yield the magnitude of the transformed input value (i.e., $V_{MAG}$ or $I_{MAG}$ of FIG. 2). The real transform output component from discrete integrator 42B is multiplied by multiplier block 40E with the reciprocal of the imaginary transform output component from discrete integrator 42A provided by reciprocal block 44, and the arctangent computed by arctan block 46, to yield the phase of the transformed input value (i.e., $\Phi_V$ or $\Phi_I$ of FIG. 2).

Figure 4:
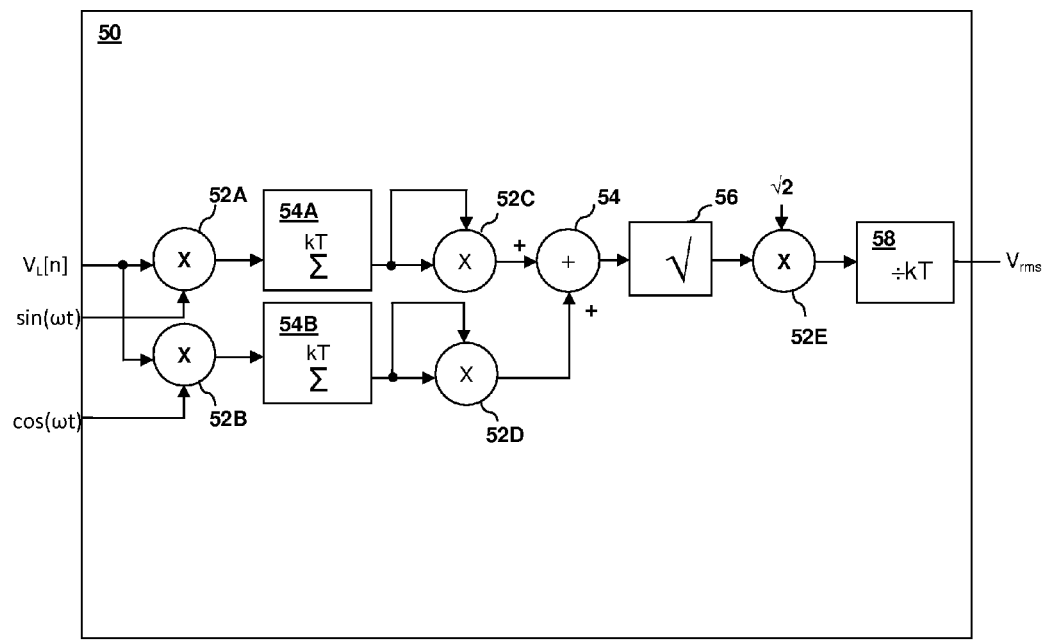
FIG. 4 is a block diagram depicting details of DFT and rms calculation block 50 of FIG. 2.

Referring now to FIG. 4, details of DFT and rms calculation block 50 are shown, in accordance with an embodiment of the invention. Filtering is performed by a pair of multipliers 52A,52B, which multiply input values provided at input $V_L[n]$ by a pair of sine and cosine coefficients sin(ω) and cos(jω) provided from look up tables (or other means such as a CORDIC block). The outputs of multipliers 52A and 52B are accumulated by respective discrete integrators 54A, 54B to yield real and imaginary transform output component values. The magnitudes of the real and imaginary transform output components are squared by multiplier blocks 52C and 52D, added by summation block 54, the square root is taken of the resulting sum by block 56, and the resulting value is multiplied by the square root of 2 in multiplier 52E and normalized by the period in block 58, to yield the rms value of load voltage $V_L$.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A power measurement system comprising:
a current measurement circuit for measuring a current through a load;
a voltage measurement circuit for measuring a voltage across terminals of the load, wherein the voltage is an AC voltage;
a complex wavelet filter for filtering an output of the current measurement circuit and an output of the voltage measurement circuit to provide complex current output components and complex voltage output components; and
a processor for receiving the complex current output components and the complex voltage output components and generating a load power measurement value, wherein the processor further determines a line frequency calibration value from the complex voltage output components, wherein the line frequency calibration value is indicative of a line frequency of the AC voltage across the terminals of the load.

2. The power measurement system of claim 1, wherein the processor computes an average load power measurement value over one or more cycles of the line frequency and uses the line frequency calibration value to adjust a number of samples of the complex current output components and the complex voltage output components used to compute the average load power measurement value.

3. The power measurement system of claim 2, wherein the complex wavelet filter is a Morlet complex wavelet filter.

4. The power measurement system of claim 1, wherein the processor is a processor that executes program instructions for generating the line frequency calibration value and the load power measurement value, wherein the power measurement system further comprises a memory for storing the program instructions, and wherein the program instructions further comprise program instructions for implementing the complex wavelet filter.

5. The power measurement system of claim 1, wherein the complex wavelet filter is implemented by a dedicated digital logic.

6. The power measurement system of claim 1, further comprising a discrete Fourier transform filter for generating a filtered magnitude of an output of the voltage measurement circuit.

7. The power measurement system of claim 6, wherein the processor further computes a magnitude of the current through the load from the filtered magnitude of the output of the voltage measurement circuit.

8. The power measurement system of claim 1, wherein the load power measurement value is a power factor describing power transferred to the load.

9. The power measurement system of claim 1, wherein the line frequency calibration value is generated by computing a phase difference between a first phase of a current measurement provided by a first output of the complex wavelet filter and a second phase of a voltage measurement provided by a second output of the complex wavelet filter during a calibration interval, and wherein the processor uses the phase difference to correct subsequent measurements performed by the power measurement system, by setting at least one delay value of at least one delay block disposed between the output of the current measurement circuit or the output of the voltage measurement circuit and the complex wavelet filter.

10. The power measurement system of claim 9, wherein the processor computes the phase difference using a CORDIC algorithm.

11. The power measurement system of claim 1, further comprising a discrete Fourier transform filter for generating a filtered magnitude of an output of the voltage measurement circuit, and wherein the line frequency calibration value is used to adjust a frequency of the discrete Fourier transform filter.

12. The power measurement system of claim 9, wherein the complex wavelet filter includes a first filter channel for filtering the output of the voltage measurement circuit according to a first reference phase, and a second filter channel for filtering the output of the voltage measurement circuit according to a second reference phase, wherein the processor subtracts the output of the first filter channel and the second filter channel to determine a derivative of the phase of the output of the voltage measurement, and wherein the processor determines the line frequency of the voltage across the load from the derivative of the phase.

13. A method of measuring electrical power supplied to a load, comprising:
first measuring a current through the load;
first filtering a result of the first measuring with a complex wavelet filter response to provide complex current output components indicative of real and imaginary portions of the current;
second measuring an AC voltage across terminals of the load;
second filtering a result of the second measuring with the complex wavelet filter response, to provide complex voltage output components indicative of real and imaginary portions of the AC voltage; and
first processing the complex current output components and the complex voltage output components to generate a load power measurement value; and
second processing the complex voltage output components to determine a line frequency calibration value indicative of a line frequency of the AC voltage across the terminals of the load.

14. The method of claim 13, wherein the first processing computes an average load power measurement value over one or more cycles of the line frequency and uses the line frequency calibration value to adjust a number of samples of the complex current output components and the complex voltage output components used to compute the average load power measurement value.

15. The method of claim 14, wherein the first and second filtering are performed by Morlet complex wavelet filtering operations.

16. The method of claim 13, wherein the first and second filtering are performed by executing program instructions using a processor.

17. The method of claim 13, wherein the first and second filtering are performed by a dedicated digital signal processing circuit.

18. The method of claim 13, further comprising:
third filtering a result of the second measuring with a discrete Fourier transform filter; and
first computing a magnitude of the voltage across the terminals of the load from a result of the third filtering.

19. The method of claim 18, further comprising second computing a magnitude of the current through the load from the magnitude of the voltage across the terminals of the load computed by the first computing.

20. The method of claim 13, wherein the load power measurement value is a power factor describing power transferred to the load.

21. The method of claim 13, wherein the second processing generates the line frequency calibration value by computing a phase difference between a first phase of a current measurement provided by a first result of the second filtering and a second phase of a voltage measurement provided by a second result of the second filtering during a calibration interval, and wherein the first processing uses the phase difference to set at least one delay applied to the result of the first measuring or the result of the second measuring.

22. The method of claim 21, wherein the computing the phase difference is performed using a CORDIC algorithm.

23. The method of claim 13, further comprising:
computing a discrete Fourier transform of the complex voltage output components; and
adjusting a frequency of the discrete Fourier transform in conformity with the line frequency calibration value.

24. The method of claim 23, wherein the second filtering is performed according to a first reference phase, and wherein the method further comprises:
- third filtering the result of the second measuring with the filter response according to a second reference phase;
- subtracting a first phase result of the second filtering and a second phase result of the third filtering to determine a derivative of the phase of the result of the second measuring, and wherein the second processing determines the line frequency of the voltage across the load from a result of the subtracting.

25. The method of claim 22, further comprising:
- first computing a phase of the voltage across the terminals of the load from a result of the second measuring; and
- second computing the line frequency by computing a derivative of the phase of the voltage across the terminals of the load.

26. An integrated circuit, comprising:
- a current measurement circuit for measuring a current through a load;
- a voltage measurement circuit for measuring an AC voltage across terminals of the load;
- a complex wavelet filter for processing an output of the current measurement circuit and an output of the voltage measurement circuit to provide complex current output components and complex voltage output components; and
- a processor for receiving the complex current output components and the complex voltage output components and generating a load power measurement value, and for processing to the complex voltage output components to determine a line frequency calibration value from the complex voltage output components, wherein the line frequency calibration value is indicative of a line frequency of the AC voltage across the terminals of the load.

27. The integrated circuit of claim 26, wherein the processor computes an average load power measurement value over one or more cycles of the line frequency and uses the line frequency calibration value to adjust a number of samples of the complex current output components and the complex voltage output components used to compute the average load power measurement value.

28. The integrated circuit claim 27, wherein the complex wavelet filter is a Morlet complex wavelet filter.

* * * * *